United States Patent [19]

Shinohara et al.

[11] Patent Number: 5,569,627
[45] Date of Patent: Oct. 29, 1996

[54] PROCESS FOR ETCHING COPPER CONTAINING METALLIC FILM AND FOR FORMING COPPER CONTAINING METALLIC WIRING

[75] Inventors: Keiji Shinohara, Kanagawa; Junichi Sato, Tokyo; Yukihiro Kamide; Toshiharu Yanagida, both of Kanagawa, all of Japan

[73] Assignee: Sony Corporation, Tokyo, Japan

[21] Appl. No.: 506,868

[22] Filed: Jul. 25, 1995

Related U.S. Application Data

[62] Division of Ser. No. 389,722, Feb. 15, 1995, Pat. No. 5,505,322, which is a continuation of Ser. No. 683,775, Apr. 11, 1991, abandoned.

[30] Foreign Application Priority Data

Apr. 12, 1990 [JP] Japan ................................ 2-097245

[51] Int. Cl.$^6$ ................................................ H01L 21/306
[52] U.S. Cl. ...................... 437/228; 156/657.1; 437/238; 437/187; 437/195
[58] Field of Search ............................ 156/656.1, 657.1; 437/228, 179, 187, 235, 238, 195

[56] References Cited

U.S. PATENT DOCUMENTS

| | | | |
|---|---|---|---|
| 4,466,859 | 8/1984 | Nelson ................................ | 156/646 |
| 4,468,284 | 8/1984 | Nelson ................................ | 156/646 |
| 4,775,550 | 10/1988 | Chu et al. ............................ | 437/228 |
| 4,983,546 | 1/1991 | Hyun et al. ......................... | 437/231 |
| 5,037,777 | 8/1991 | Mele et al. .......................... | 437/228 |
| 5,082,801 | 1/1992 | Nagata ................................ | 437/190 |
| 5,268,332 | 12/1993 | Alugbin et al. .................... | 437/228 |
| 5,275,972 | 1/1994 | Ogawa et al. ...................... | 437/195 |
| 5,445,998 | 8/1995 | Zimmer .............................. | 437/228 |

OTHER PUBLICATIONS

"Silicon Processing For TRe VLSI Era–vol.2–Process Integration", Wolf; Lattice Press, Sunset Beach, California; © 1990; pp. 192–194.

Primary Examiner—R. Bruce Breneman
Assistant Examiner—George Goudreau
Attorney, Agent, or Firm—Hill, Steadman & Simpson

[57] ABSTRACT

A method for forming a copper wiring in a semiconductor device utilizes a copper film with a pattern mask thereon. Exposed portions of the copper film are etched to form a copper wiring. An insulation film is deposited over the copper wiring, including on side walls thereof. A portion of the insulation film is removed to leave an insulation film substantially only on side walls of the copper which is thinner than before the removing. A first dielectric film is formed between the copper wiring up to a top of the pattern mask but not on top of the pattern mask in order to embed and flatten regions between the copper wiring and pattern mask so that the regions are substantially level with the top of the pattern mask. A second dielectric layer is formed on the first dielectric layer to provide a flat surface over the copper wiring and pattern mask.

3 Claims, 11 Drawing Sheets

PROCESS FOR ETCHING COPPER CONTAINING METALLIC FILM AND FOR FORMING COPPER CONTAINING METALLIC WIRING

This application is a divisional of Ser. No. 08/389,722 which was filed on Feb. 15, 1995; now U.S. Pat. No. 5,505,322; which is a continuation of Ser. No. 07/683,775 which was filed on Apr. 11, 1991 and is now abandoned.

BACKGROUND OF THE INVENTION

1. Field of the Invention

The present invention relates generally to a process for etching a copper containing metallic film and a process for forming wiring of a copper containing metal in semiconductor devices.

2. Description of the Background Art

Generally, aluminum containing metallic materials have been used for metallic wiring in semiconductor devices, such as ULSI and VLSI devices. As semiconductor devices become more and more minute, the sizes of metallic wiring, required by the design rules for such devices, become smaller than 0.5 µm. However, in a case where an aluminum containing metal is used for wiring, if the size thereof becomes smaller than 0.5 µm, it is known that the reliability of wiring decreases. In addition, the aspect ratio of wiring becomes a relatively great value, and it therefore becomes difficult to perform flattening of an insulation film thereafter.

In recent years, attention has been given to wiring of a copper containing metal on the following grounds, in addition to the aforementioned disadvantage in wiring of aluminum containing metal. That is, the electrical resistance of Cu (about 1.4 $\mu\Omega.cm$) is smaller than that of Al (about 2.8 $\mu\Omega.cm$), and copper containing metallic film can be made thinner than aluminum containing metallic film, even if both widths thereof are the same.

Various processes for etching such a copper containing metallic film to form metallic wiring have been proposed. One of such processes is disclosed in Japanese Patent Second (examined) Publication (Tokko Sho.) No. 61-40757. In this process, etching of a copper containing metallic film is performed by a glow discharge in an organic gas atmosphere, which organic gas contains methyl/methylene groups. While a temperature of the copper is maintained in a range of 40° to 200° C. Another process is disclosed in Lecture Paper 1p-L-1 of the Japanese Applied Physical Society in the spring of 1989 ("High-Temperature RIE of Cu Wiring"). In this process, etching of a copper containing metallic film is performed at a high temperature greater than 350° C. by means of chlorine gases, e.g. $Cl_2$ or $CCl_4$, and nitrogen gas ($N_2$). Another process is disclosed in Japanese Patent First (unexamined) Publication (Tokkai Hei.) No. 1-234573. In this process, by adding hydrogen ($H_2$) to an etching gas while maintaining the same at a high temperature, a slightly etchable copper oxide is reduced so as to enable dry etching of a copper containing metallic film. A further process is disclosed in Japanese Patent First (unexamined) Publication (Tokkai Sho.) No. 63-12138. In this process, patterning of a copper containing metallic film is performed by way of so-called ion milling method by irradiating neutral particles on the copper film.

The aforementioned etching processes are performed at a high temperature except for the process of Japanese Patent First (unexamined) Publication (Tokkai Sho.) No. 63-12138. In the processes performed at a high temperature, there are disadvantages in that it is difficult to maintain uniformity of thermal distribution in the substrate having the copper containing metallic film, and that the surface of the copper containing metallic film tends to become oxidized. On the other hand, since the process of Japanese Patent First (unexamined) Publication (Tokkai Sho.) No. 63-12138 uses a mask made of $SiO_2$, TiN or the like as a protective film in order to prevent oxidization of the copper containing metallic film, this process is quite practical to use. However, in this process, in a case where a barrier metal layer is used as a foundation of the copper containing metallic film, two etching steps must be used, one of which is a sputter etching step for the copper containing metallic film by means of, e.g. an ion milling apparatus, and the other of which is an etching step of the barrier metal layer by way of reactive ion etching which uses fluorine (F) radicals. This means increased man-hours are required for carrying out the process.

SUMMARY OF THE INVENTION

It is therefore a principal object of the present invention to provide a process for etching a copper containing metallic film, the process being able to perform etching of a barrier metal layer in the same etching apparatus as that for etching copper containing metallic film.

According to one aspect of the present invention, a process for dry etching a copper containing metallic film formed on a substrate, comprises the steps of: producing $Cu(NO_3)_2$ by using an etching gas selected from the group consisting of a mixed gas of an N containing gas and an O containing gas, and an N and O containing gas, while heating the copper containing metallic film at a temperature below 200° C.; and subliming the produced $Cu(NO_3)_2$.

According to another aspect of the invention a process for dry etching a copper containing metallic film formed on a substrate, comprises the steps of: producing $Cu(NO_3)_2$ by using an etching gas selected from the group consisting of a mixed gas of an N containing gas, an O containing gas and a F containing gas, and a mixed gas of an N and O containing gas and a F containing gas, while heating the copper containing metallic film at a temperature below 200° C.; and subliming the produced $Cu(NO_3)_2$.

The principles of the present invention may further be applied to a process for forming wiring of a copper containing metal, comprising the steps of: adding a first gas selected from the group consisting of a mixed gas of a nitrogen containing gas, an oxygen containing gas, and a nitrogen oxide (NOx) containing gas, to a second gas selected from the group consisting of a chlorine containing gas and a bromine containing gas, to form an etching gas; and dry etching a copper containing metal by using the etching gas.

According to a still further aspect of the invention a process for forming wiring of a copper containing metal comprises the steps of: adding a first gas selected from the group consisting of a mixed gas of a nitrogen containing gas, an oxygen containing gas, and a nitrogen oxide (NOx) containing gas, to a second gas selected from the group consisting of a chlorine containing gas and a bromine containing gas, to form an etching gas; dry etching a film made of a copper containing metal by using the etching gas; and oxidizing the surface of the etched film, the etching and oxidizing steps being alternately performed.

In addition, according to the present invention, a process for forming wiring of a copper containing metal may comprise the steps of: etching a copper containing metallic film to form a copper containing metallic wiring; causing an insulation film to accumulate on the copper containing metallic wiring; removing a part of the insulation film to leave a thin and minute insulation film formed on the side walls of the copper containing metallic wiring while leaving a mask for etching; and forming an interlayer film for flattening between the copper containing metallic films.

Finally, according to another aspect of the present invention, a process for forming a wiring of a copper containing metal comprises the steps of: sequentially forming a multilayer resist film which comprises at least one organic polymer film and at least one oxidation-resistant film, on a copper containing metallic film; dry etching and over-etching the organic polymer film by using at least one of the oxidation-resistant films as etching masks, and by using an etching gas comprising a mixed gas of a first and of a second gas, the first gas, being selected from the group consisting of a mixed gas of a nitrogen containing gas an oxygen containing gas, and a nitrogen oxide (NOx) containing gas, and the second gas being selected from the group consisting of a chlorine containing gas or a bromine containing gas.

BRIEF DESCRIPTION OF THE DRAWINGS

The present invention will be understood more fully from the detailed description given herebelow and from the accompanying drawings of the preferred embodiments of the invention. However, the drawings are not intended to imply a limitation of the invention to a specific embodiment, but are for explanation and understanding only.

In the drawings.

DESCRIPTION OF THE PREFERRED EMBODIMENT

Figure 2A:
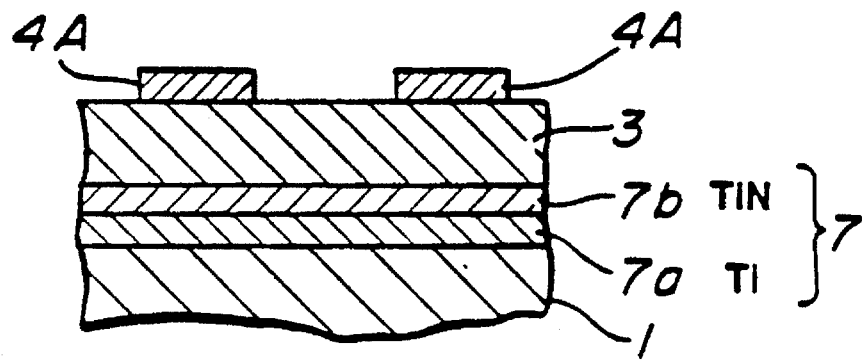
FIGS. 2(A) and 2(B) are schematic views showing the second preferred embodiment of an etching process for a copper containing metal, according to the present invention.
Figure 2B:
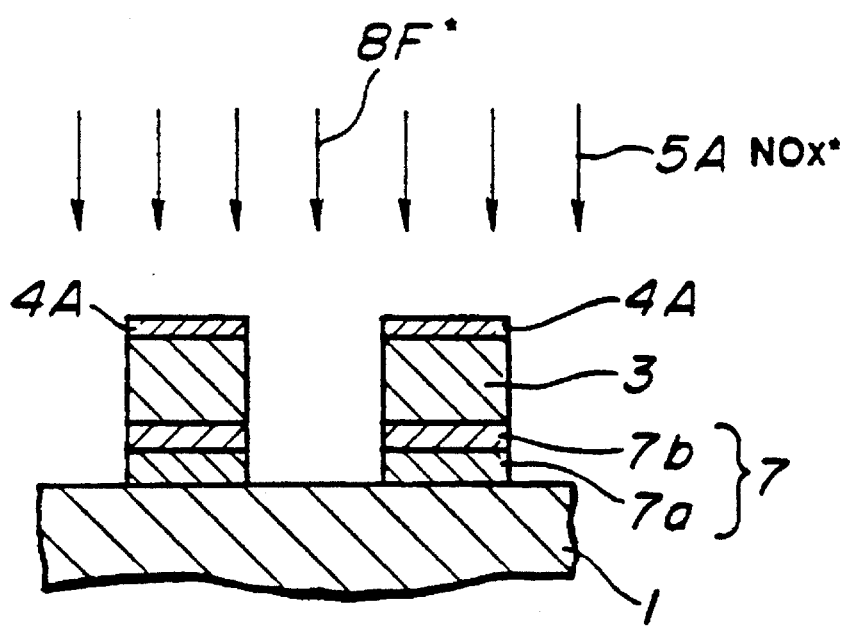
Figure 3:
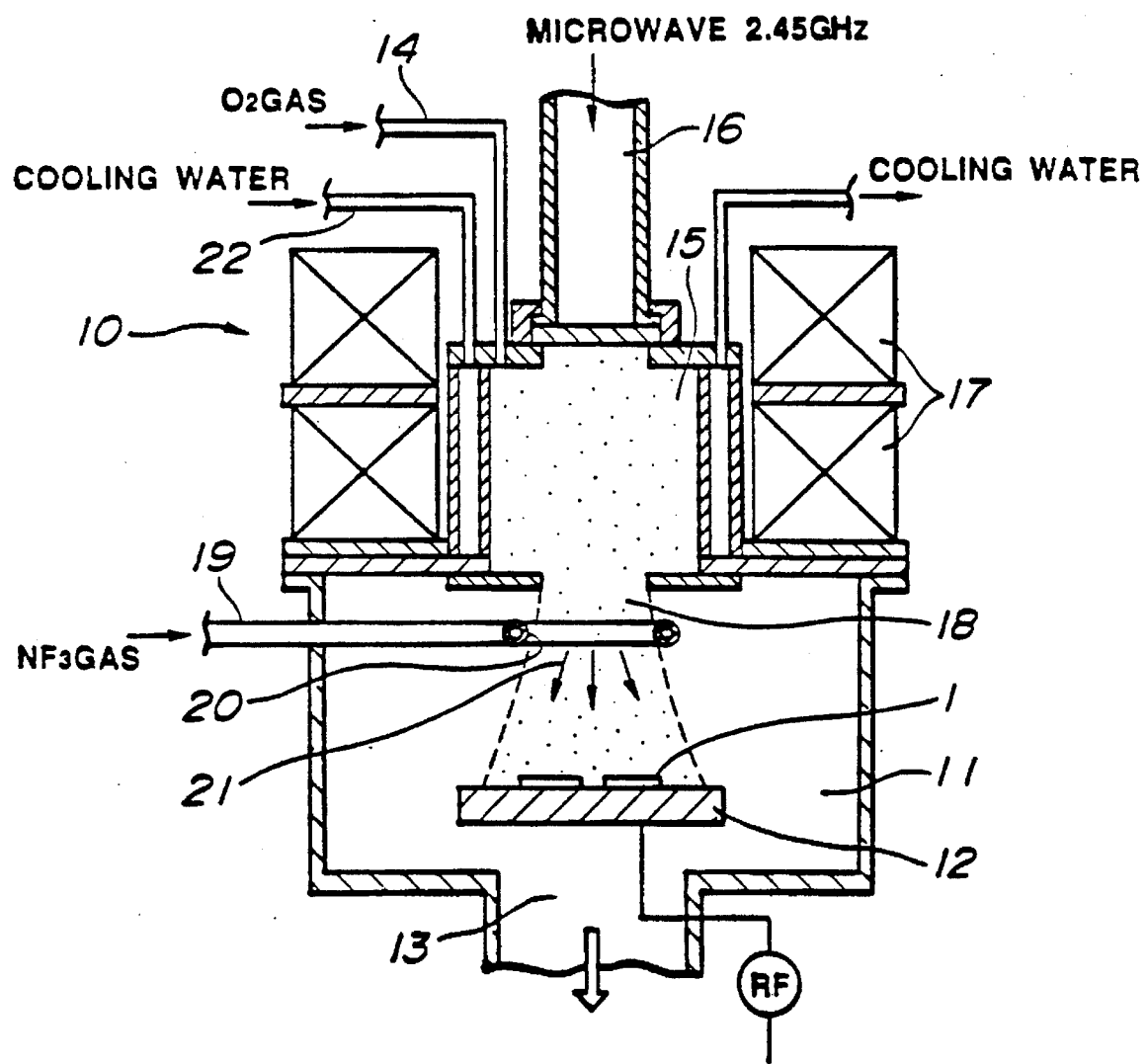
FIG. 3 is a schematic view of an etching apparatus which can be applied to the second preferred embodiment of the etching process.

Referring now to the drawings, particularly to FIGS. 1 to 3, there are shown the preferred embodiments of an etching process for a copper containing metal according to the present invention.

Figure 1A:
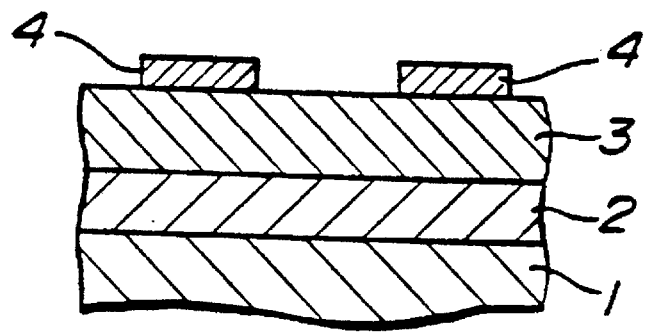
FIGS. 1(A) and 1(B) are schematic views showing the first preferred embodiment of an etching process for a copper containing metal, according to the present invention.
Figure 1B:
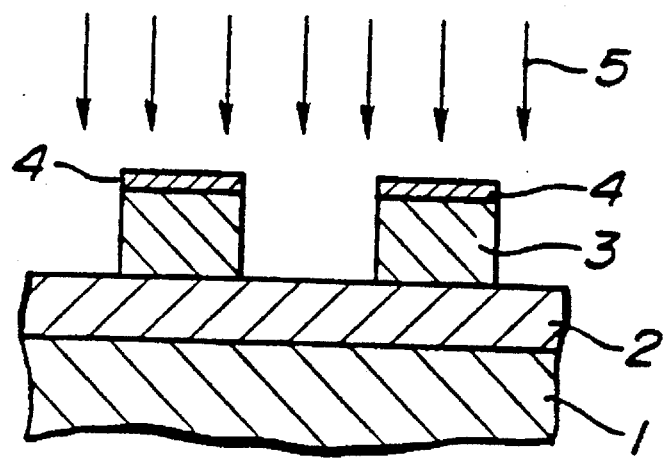

FIGS. 1(A) and 1(B) show the first preferred embodiment of an etching process for a copper containing metallic film according to the present invention.

In FIG. 1(A), the reference numeral 1 denotes a substrate, such as a silicon substrate, the reference numeral 2 denotes a layer insulation film, and the reference numeral 3 denotes a copper containing metallic film formed on the layer insulation film 2. On the entire upper surface of the copper containing metallic film 3, a mask pattern 4 is formed. The mask pattern 4 is made of a heat-resistant inorganic material, such as $SiO_2$, which can withstand a temperature of about 200°.

Then, a plasma gas is formed by irradiating, microwaves for example, to a source gas. The substrate 1, on which the mask pattern 4 is formed and which serves as a partially fabricated item, is arranged in a reactive ion etching apparatus for etching the film by active species in the plasma gas. After the etching apparatus is evacuated, the copper containing metallic film 3 is etched by means of $NO_3$ gas 5 as shown in FIG. 1(B), while the copper containing metallic film 3 is heated at a temperature below 200° in the vacuum atmosphere. The etching conditions are as follows.

| Source Gas: | $NO_3$ 50$_{SCCM}$ |
|---|---|
| Pressure: | 50 mTorr |
| Power Density: | 0.5 W/cm$^2$ |
| Temperature: | 150–200° C. (Copper Containing metallic Film 3) |

In this etching process, the active species in the plasma gas reacts with Cu to produce $Cu(NO_3)_2$. At this time, the produced $Cu(NO_3)_2$ is sublimed, so that dry etching can be performed without oxidizing the copper containing metallic film 3. The aforementioned sublimation of $Cu(NO_3)_2$ is well known. Since this etching process does not use chlorine gases (Cl containing gas) which are used in conventional etching processes of aluminum, the active species in the plasma gas react only with Cu when sputtering, that is, it does not react with either the mask pattern 4 nor the layer insulation film 2 serving as a foundation. Therefore, there is an advantage in that the selection ratio of the mask pattern 4 to the foundation can be a relatively great value.

Furthermore, in this embodiment, as the etching source gas, other gases may be substituted for $NO_3$. For example, it may be a mixed gas of $O_2$ gas and a gas selected from the group consisting of $NO_2$, $N_2O_2$, $N_2O$, NO $N_2$ and so forth. In the etching process of this embodiment, in a case where a barrier metal layer (not shown) is provided between the layer insulation film 2 and the copper containing metallic film 3, the barrier metal layer may be etched by supplying a gas which may produce F radicals, after etching the copper containing metallic film 3.

FIGS. 2(A), 2(B) and 3 show the second preferred embodiment of an etching process for a copper containing metal, according to the present invention.

As shown in FIG. 2(A), a barrier metal layer 7 comprising Ti 7a and TiN 7b, and a copper containing metallic film 3 are sequentially formed on a substrate 1, such as a silicon substrate. On the entire upper surface of the copper containing metallic film 3, a mask pattern 4A is formed. The mask pattern 4A is made of a heat-resistant, hard-cured resist which can withstand a temperature of about 200° C.

Then, the substrate 1, on which the mask pattern 4 is formed and which serves as a partially fabricated item, is arranged on a processing table 12 in an etching chamber 11 of an etching apparatus 10 as shown in FIG. 3. Thereafter, the etching chamber 11 is evacuated to form a vacuum atmosphere therein so as to enable etching of the copper containing metallic film 3, while heating the copper containing metallic film 3 on the substrate 1 in the etching chamber 11 at a temperature of 150° to 200° C. by means of a heating means (not shown). In parallel with these processes, a first gas supply pipe 14 supplies $O_2$ gas for a plasma chamber 15 which is arranged above the etching chamber 11, while a waveguide 16 supplies microwaves having a frequency of, e.g. 2.45 GHz, to an upper wall of the plasma chamber 15, so as to produce a plasma gas from the $O_2$ gas in the plasma chamber 15. In parallel with these processes, electrical power is supplied to an electromagnetic coil 17 which is arranged around the plasma chamber 15, so as to allow the formed plasma gas to move along the magnetic field of the electromagnetic coil 17 to be extracted to the etching chamber 11 through a plasma extraction window 18 formed on a wall between the plasma chamber 15 and the etching chamber 11. Simultaneously to these processes, a nozzle 20 of a second gas supply pipe 19 supplies $NF_3$ gas for the $O_2$ plasma gas which is extracted to the etching chamber 11 through the plasma extraction window 18, so as to irradiate a $NF_3$ containing plasma gas 21 on the copper containing metallic film 3 of the substrate 1 in the etching chamber 11. The nozzle 20 is arranged in the etching chamber 11 below the plasma extraction window 18 and is formed so as to surround the plasma extraction window 18. During this etching process, cooling water is supplied to a water passage 22 between the plasma chamber 15 and the electromagnetic coil 17 so as to cool the etching apparatus 10. These etching conditions are as follows.

| Source Gas: | $NF_3/O_2$ 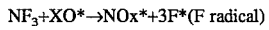 $_{SCCM}$ |
| --- | --- |
| Pressure: | 50 mTorr |
| Microwave: | 800 w/cm² |
| RF Bias: | 300 W/cm² |
| Temperature: | 150–200° C. (Copper Containing Metallic Film 3) |

In this etching process, O radical (O) serving as the active species in the plasma gas which is extracted from the side of the etching chamber 11 through the plasma extraction window 18, reacts with $NF_3$ supplied from the nozzle 20. This reaction can be expressed as follows.

$$NF_3 + XO^* \rightarrow NOx^* + 3F^* (F\ radical)$$

As shown in FIG. 2(B), NOx* 5A reacts with Cu of the copper containing metallic film 3 to produce $Cu(NO_3)_2$. This $Cu(NO_3)_2$ is sublimed by heating the copper containing film 3 at a temperature of 150° to 200° C. so that etching of the copper containing metallic film 3 is performed, and that the dry etching of Ti and TiN of the barrier metal layer 7 is performed by means of F*8. Therefore, in this etching process, there is an advantage in that the etching of the copper containing metallic film 3 is not only performed, but the etching of the barrier metal layer is also performed in a series of processes. In this etching process, $O_2$ gas is supplied from the first gas supply pipe, and separated from the substrate 1 by a relatively great distance in order to prevent Cu from being oxidized by O*.

Furthermore, in this second embodiment, as the etching source gas, other gases may be substituted for $NF_3$. For example, a mixed gas of $O_2$ gas and a gas selected from the group consisting of $NO_3$, $NO_2$, $N_2O_2$, $N_2O$, NO, $N_2$ and so forth, may be substituted for $NF_3$ gas. In this etching process, in a case where the barrier metal layer 7 is used, the barrier metal layer 7 may be etched by supplying gas which may produce F radicals, after etching the copper containing metallic film 3.

In these first and second preferred embodiments, inorganic materials other than the resist and $SiO_2$, a polyamide or the like may be substituted for the resist or $SiO_2$ as the mask pattern 4, as long as it may withstand a temperature of about 200° C.

As mentioned above, according to the first and second embodiment of the present invention, $Cu(NO_3)_2$ is produced by means of a mixed gas of N gases (N containing gas) and O gases (O containing gas), or by means of N and O containing gas while heating the copper containing metallic film at a temperature below 200° C. The produced $Cu(NO_3)_2$ is sublimed to perform the dry etching of the copper containing metallic film. Therefore, according to the present invention, it is possible to take a greater selection ratio of the copper containing metallic film to the foundation, than that of conventional etching processes which use chlorine gases, and it is possible to prevent the copper containing metallic film from being oxidized.

In addition, when the barrier metal layer is used as the foundation of the copper containing metallic film, the etching of the barrier metal layer can be performed only by supplying a gas which may produce F radicals, in the same etching apparatus used for etching the copper containing metallic film. This can improve working efficiency.

Referring to FIGS. 4 to 18, there are shown the preferred embodiments of the process of the invention directed to forming a wiring of a copper containing metal.

Figure 4:
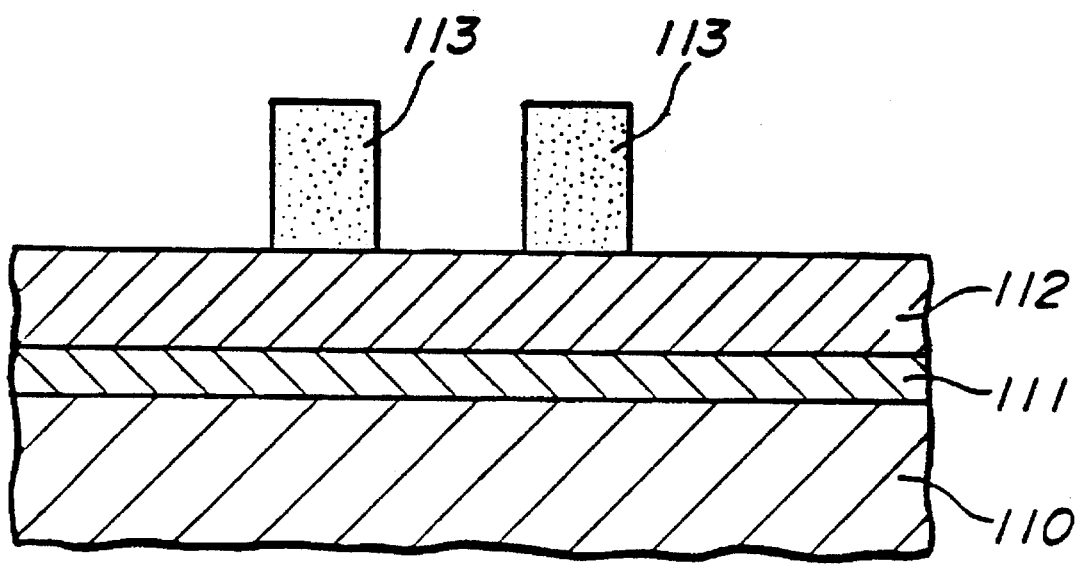
FIGS. 4 and 5 are schematic views showing a third preferred embodiment of a process for forming a wiring of a copper containing metal, according to the present invention.
Figure 5:
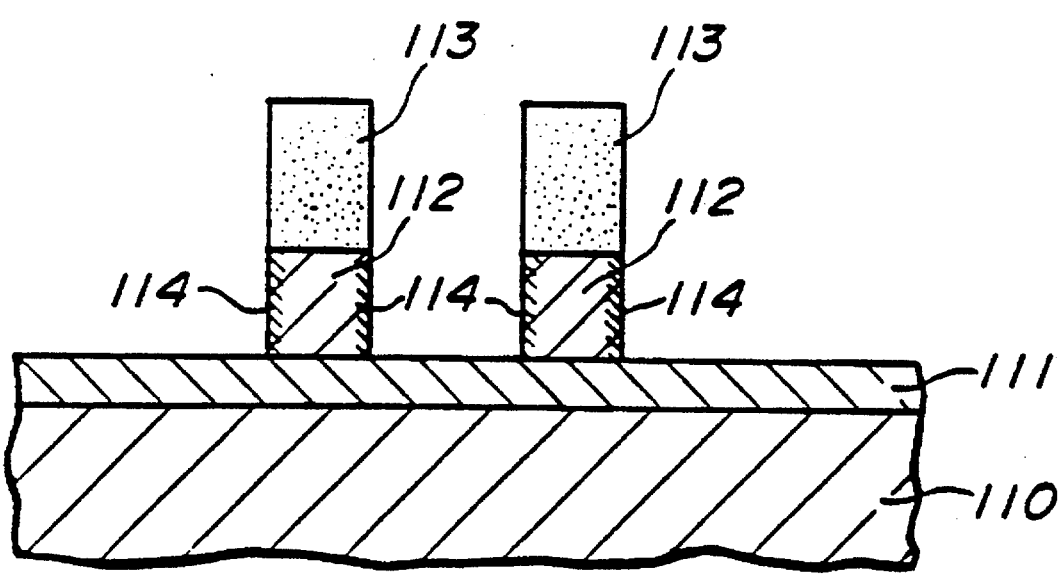

FIGS. 4 and 5 show the third preferred embodiment of the process of the invention directed to forming a wiring of a copper containing metal.

In this embodiment, a silicon oxide film 111 is formed on a silicon substrate 110. A copper film 112 is caused to accumulate on this silicon oxide film 111 so that the thickness of the copper film 112 becomes 3000 Å. In addition, resists 113 are applied on the copper film 112 to perform patterning.

Next, the copper film is etched by means of an ECR (magnetic-field microwave type) etching apparatus, by using $N_2O$ which is a nitrogen oxide gas, and boron trichloride ($BCl_3$) which is a chlorine gas, as etching gases. The etching conditions are as follows.

| Flow Rate of Etching Gas: | |
| --- | --- |
| 1)$N_2O$ | 50$_{SCCM}$ |
| 2)$BCl_3$ | 20$_{SCCM}$ |
| Pressure: | 10 mTorr |
| Microwave Current: | 300 mA |
| RF Power: | 50 W |
| Temperature of Substrate: | 200° C. |

In the aforementioned etching process, the copper oxide film formed on the surface of the copper film 112 is reduced by means of $BCl_3$, so that the copper (Cu) reacts with $N_2O$ to produce a copper nitrate ($Cu(NO_3)_2$ which is sublimed to be discharged. In addition, on the side walls of the copper wiring 112A formed in accordance with this etching, $CuCl_2$ films 114 serving as side-wall protective films are formed by Cl dissociated from $BCl_3$. Therefore, dry processing can be surely accomplished. In this case, $Cu(NO_3)_2$ is sublimed to be discharged by setting the temperature of the substrate to be 200° C. However, $CuCl_2$ is not discharged to remain being arranged on the side wall of the copper wiring 112A since the vapor pressure of $CuCl_2$ is relatively low.

Although $N_2O$ and $BCl_3$ are used as the etching gases in this embodiment, a mixed gas of nitrogen gases (e.g. $N_2$, $NF_3$) and oxygen gases (e.g. $O_2$, $O_3$), or a mixed gas of a gas selected from the group consisting of nitrogen oxide gases (e.g. $N_2O$, NO, $NO_2$, $NO_3$, $N_2O_2$) and a gas selected from the group consisting of chlorine gases (e.g. $Cl_2$, $BCl_3$) and boron gases (e.g. $Br_2$, $BBr_3$), may also be used as etching gases.

In addition, the aforementioned etching conditions may be selected in accordance with selection of gas. By setting the temperature of the substrate at 200°–250°, a side-wall protective effect can be obtained.

Figure 6:
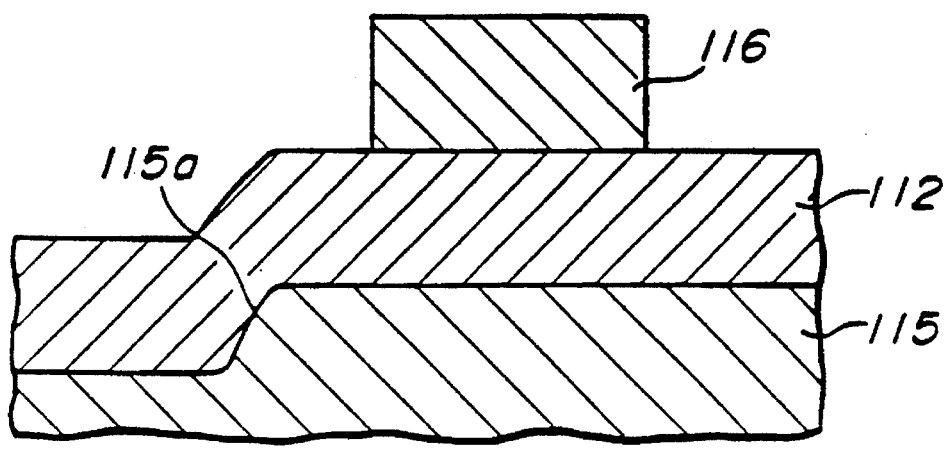
FIGS. 6 to 8 are schematic views showing a fourth preferred embodiment of a process for forming a wiring of a copper containing metal according to the present invention.
Figure 7:
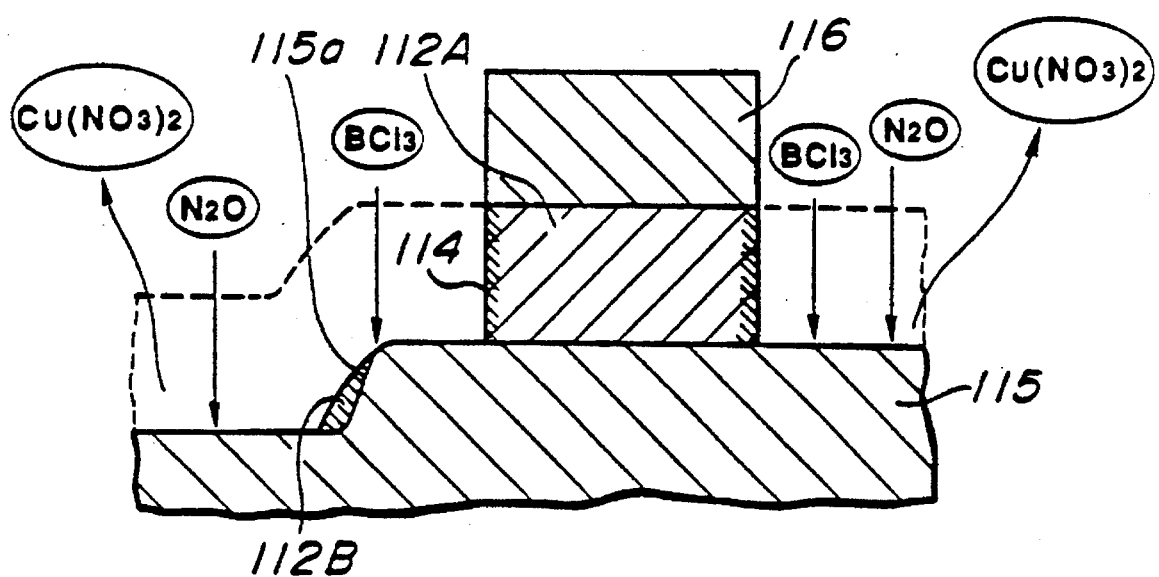
Figure 8:
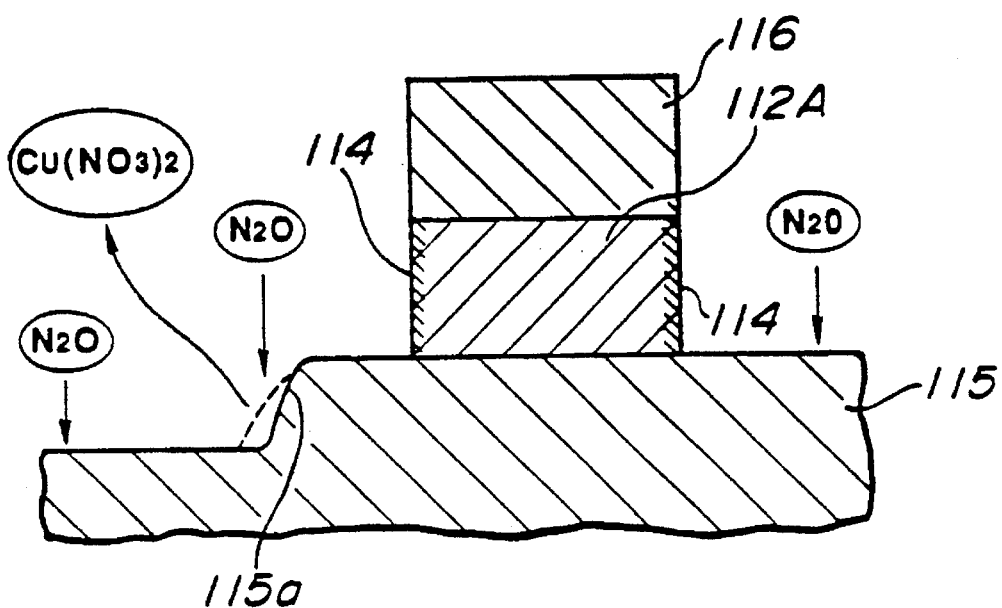

FIGS. 6 to 8 show a fourth preferred embodiment of a process for forming wiring of a copper containing metal, according to the present invention.

In this embodiment, the copper film 112 is caused to accumulate on a layer insulation film 115 having a step portion 115a, and a given pattern of $SiO_2$ mask 116 is formed on the copper film 112.

Next, until the layer insulation film 115 is exposed, etching is performed by means of the ECR etching apparatus in the same manner as that of the first preferred embodiment. The etching conditions are as follows.

| Flow Rate of Etching Gas: | |
|---|---|
| 1) $N_2O$ | $50_{SCCM}$ |
| 2) $BCl_3$ | $20_{SCCM}$ |
| Pressure: | 10 mTorr |
| Microwave Current: | 300 mA |
| RF Power: | 50 W |
| Temperature of Substrate: | 200–250° C. |

Similar to the first preferred embodiment, in the aforementioned etching process, the copper oxide film formed on the surface of the copper film 112 is reduced by means of $BCl_3$, so that the copper (Cu) reacts with $N_2O$ to produce a copper nitrate, $(Cu(NO_3)_2)$, which is sublimed to be discharged. In addition, on the side walls of copper wiring 112A formed by this etching. $CuCl_2$ films 114 serving as side-wall protective films are formed by Cl dissociated from $BCl_3$. Therefore, dry processing can be surely accomplished. However, at the time when the layer insulation film 115 is exposed, the side wall 112B of copper shown in FIG. 7 remains arranged at the step portion 115a due to the external shape of the copper film 112.

Next, the etching gas is switched to $N_2O$ only, and over-etching is performed to remove the side wall 112B of copper remaining on the step portion 115a. At this time, since $CuCl_2$ films 14 serving as side-wall protective films are formed on the side walls of the copper wiring 112A, no side-etching is performed. Furthermore, by switching the etching gas to $N_2O$ only, it is possible to prevent etching of the layer insulation film 115 from being performed due to $BCl_3$ which can be an ion and which is reducible, and to hold the aspect ratio of the wiring low.

Figure 9:
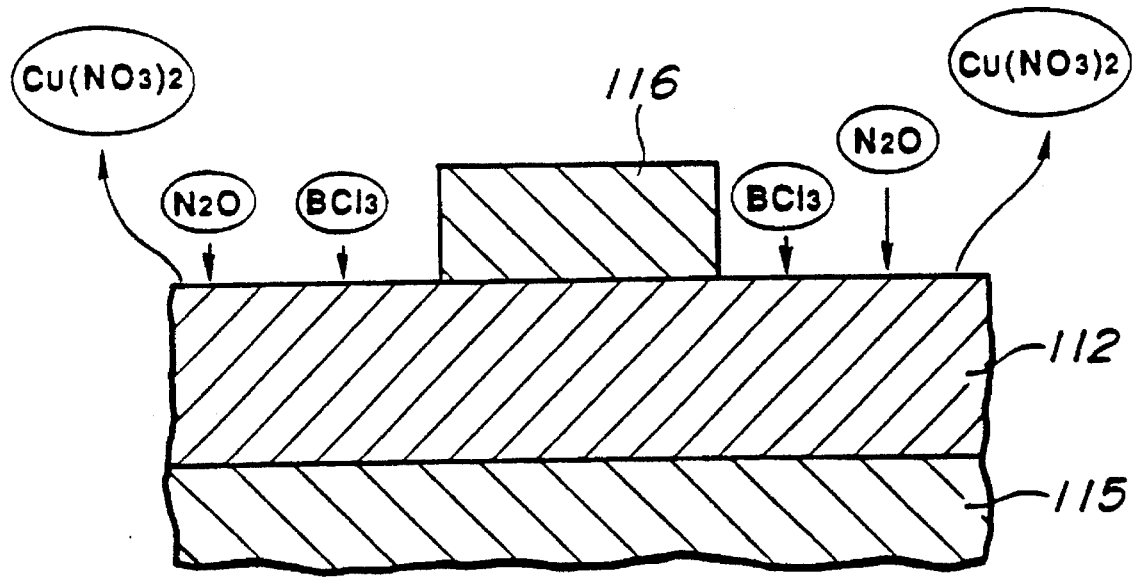
FIGS. 9 to 11 are schematic views showing the fifth preferred embodiment of a process for forming a wiring of a copper containing metal according to the present invention.
Figure 10:
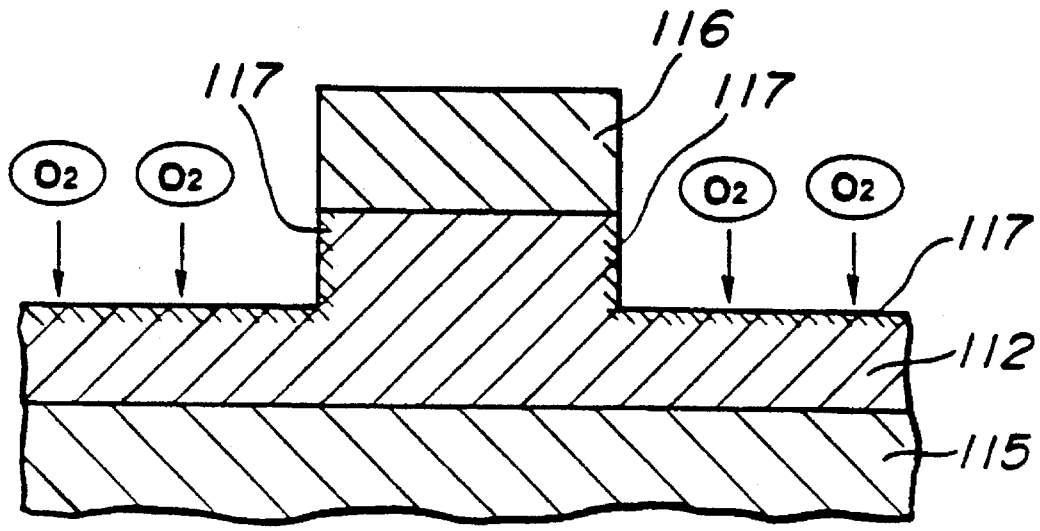
Figure 11:
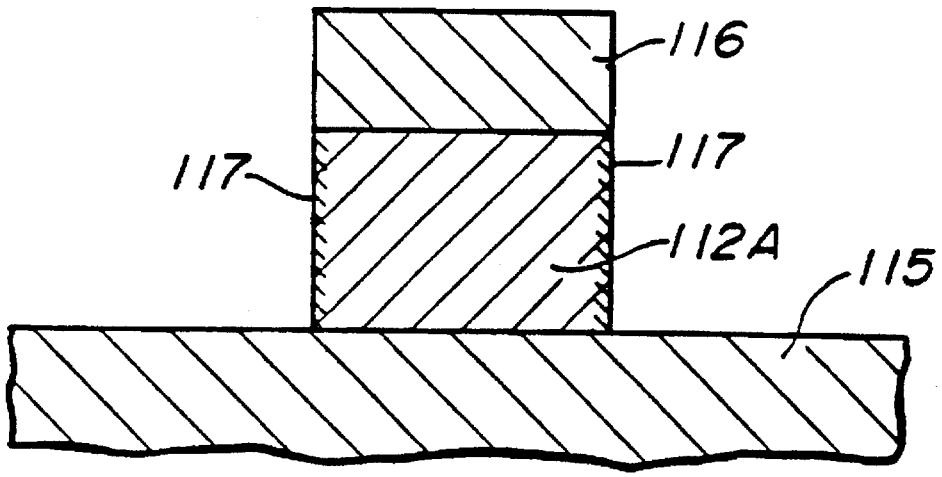

FIGS. 9 to 11 show the fifth preferred embodiment of a process for forming wiring of a copper containing metal, according to the present invention.

In this embodiment, similar to the second preferred embodiment, the copper film 112 having a thickness of, e.g. 3000 Å, is caused to accumulate on the layer insulation film 115, and the patterning of $SiO_2$ mask 116 is performed on the copper film 112 (See FIG. 9). Etching of about 500 Å is performed by means of the ECR etching apparatus under the following etching conditions.

| Flow Rate of Etching Gas: | |
|---|---|
| 1) $N_2O$ | $50_{SCCM}$ |
| 2) $BCl_3$ | $20_{SCCM}$ |
| Pressure: | 10 mTorr |
| Microwave Current: | 300 mA |
| RF Power: | 50 W |
| Temperature of Substrate: | 200–250° C. |

After the dry processing of the copper film 112 is performed by forming $Cu(NO_3)_2$ in accordance with the aforementioned etching process similar to the aforementioned first and second preferred embodiments, the etched surface of the copper film 112 is oxidized by $O_2$ or $O_2$ plasma so as to form a copper oxide film 117. For example, this oxidation process can be performed by means of a plane-parallel plate type etching apparatus under the following conditions.

| Flow Rate of Introduced $O_2$: | $200_{SCCM}$ |
|---|---|
| RF Power: | 13.56 MHz. 400 W |
| Pressure: | 1 Torr |
| Time: | 5 seconds |

This oxidation process may be performed in the ECR etching apparatus.

By repeating the aforementioned etching and oxidation processes, the copper wiring 112A as shown in FIG. 11 may be formed. In this embodiment, since etching is sequentially performed while the copper oxide film 117 having the side-wall protective function is formed, dry processing can be surely accomplished.

In this embodiment, various gases, various etching conditions and various oxidation conditions can be applied thereto, as long as the dry etching and the surface oxidizing processing of the etched film are alternatively performed, the dry etching using a mix of first and second gases, the first gas being selected from the group consisting of a mixed gas of nitrogen gases, oxygen gases, and a nitrogen oxide gas (NOx), and the second gas being selected from the group consisting of chlorine or boron gases.

FIGS. 12 to 16 show the sixth preferred embodiment of a process for forming wiring of a copper containing metal, according to the present invention.

This embodiment uses a mask made of an inorganic material used for etching the copper containing metallic wiring. After dry etching, $TEOS-SiO_2$ and P (plasma)-$SiO_2$ are sequentially caused to accumulate on the copper film 112, so as to obtain an interlayer film structure having no step.

Figure 12:
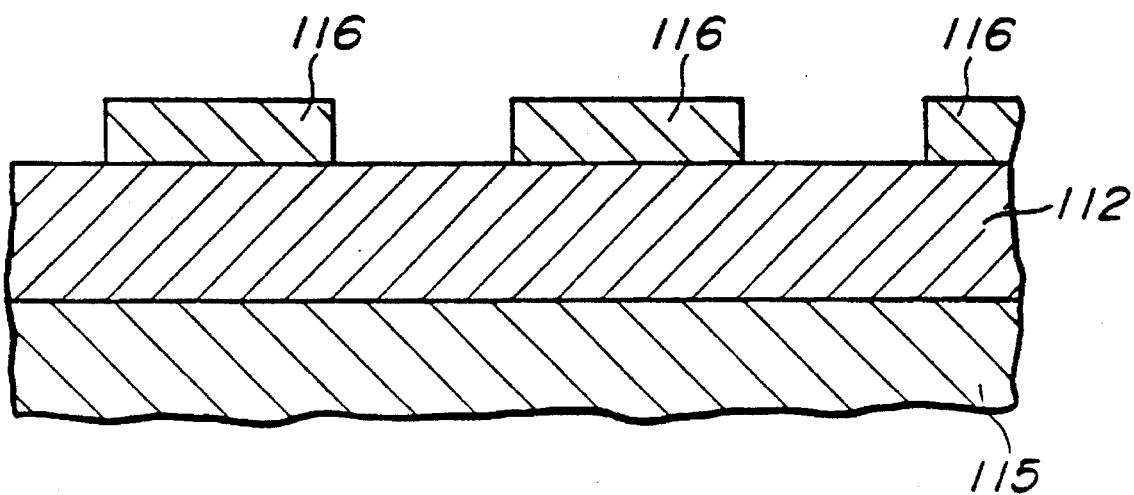
FIGS. 12 to 16 are schematic views showing the sixth preferred embodiment of a process for forming a wiring of a copper containing metal according to the present invention.
Figure 13:
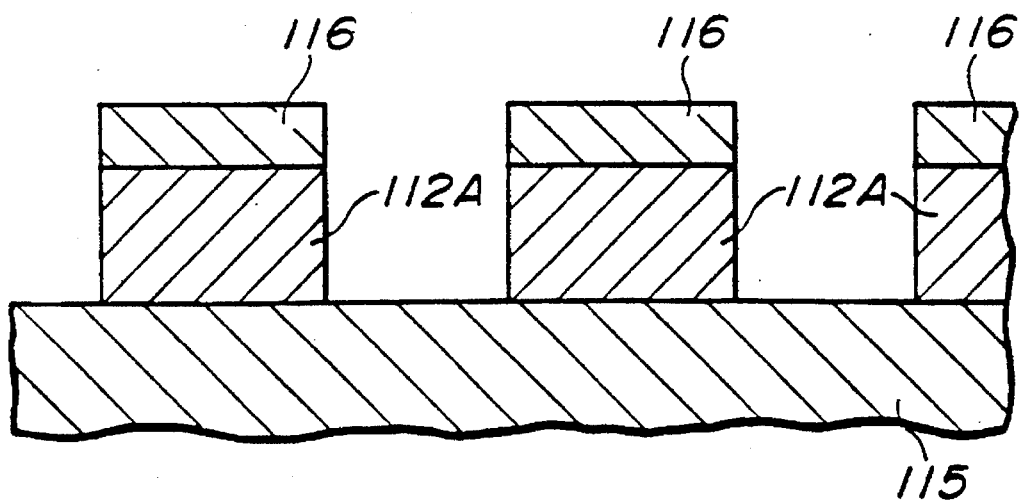

As shown in FIG. 12, the copper film 112 is caused to accumulate on the layer insulation film 115, and a given patterning of $SiO_2$ mask 116 is performed thereon.

Next, in the same condition as that of the aforementioned third to fifth embodiments, the dry etching is performed by using $BCl_3$ and $N_2O$ as etching gases, to cause the layer insulation film 115 serving as the foundation to be exposed.

Next, while leaving the $SiO_2$ mask 116, a P-$SiO_2$ film 118 is allowed to accumulate on the entire surface by means of PECVD. The CVD conditions are as follows.

| Flow Rate of Gas: | |
|---|---|
| 1) TEOS | $350_{SCCM}$ |
| 2) $O_2$ | $350_{SCCM}$ |
| Pressure of GAS: | 10 Torr |
| RF Power: | 350 w |
| Temperature of Substrate: | 390° C. |

Figure 14:
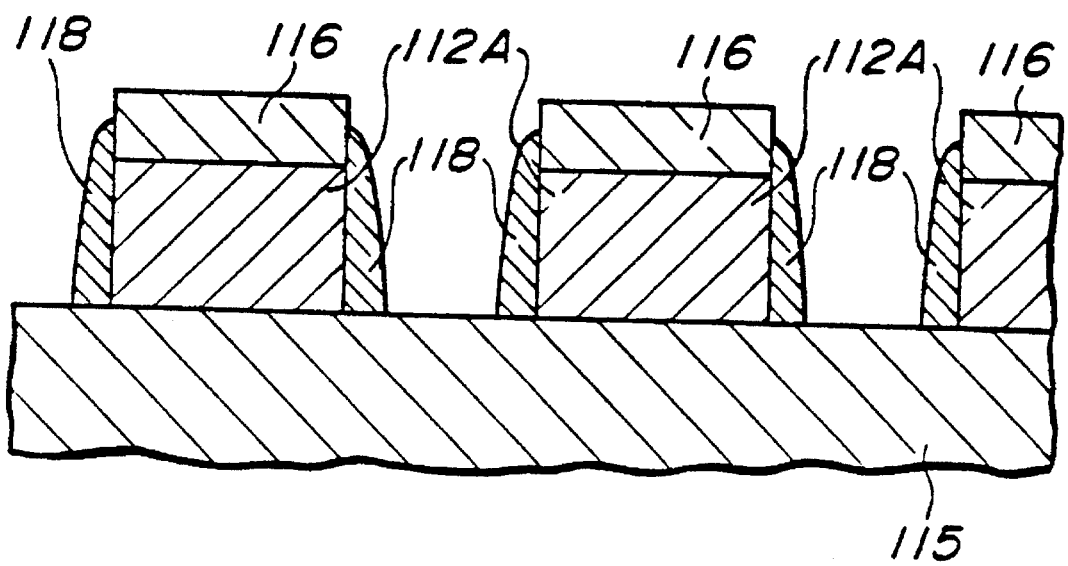

Then, an etch-back of P-$SiO_2$ is sequentially performed, so as to cause the P-$SiO_2$ film 118 to be thinly deposited on the side walls of the copper wiring 112A and the $SiO_2$ as shown in FIG. 14. This etch-back is performed by magnetic-field plasma etching, and the conditions thereof are as follows.

| Flow Rate of Gas: | |
| --- | --- |
| Nitrogen Trifluoride ($NF_3$) | $1000_{SCCM}$ |
| Pressure of Gas: | 300 mTorr |
| RF Power: | 450 W |
| Magnetic Flux Density: | 50 Gauss |

Since the aforementioned P-$SiO_2$ film 118 is a dense insulation film, it can assure pressures between the copper wiring 112A.

Figure 15:
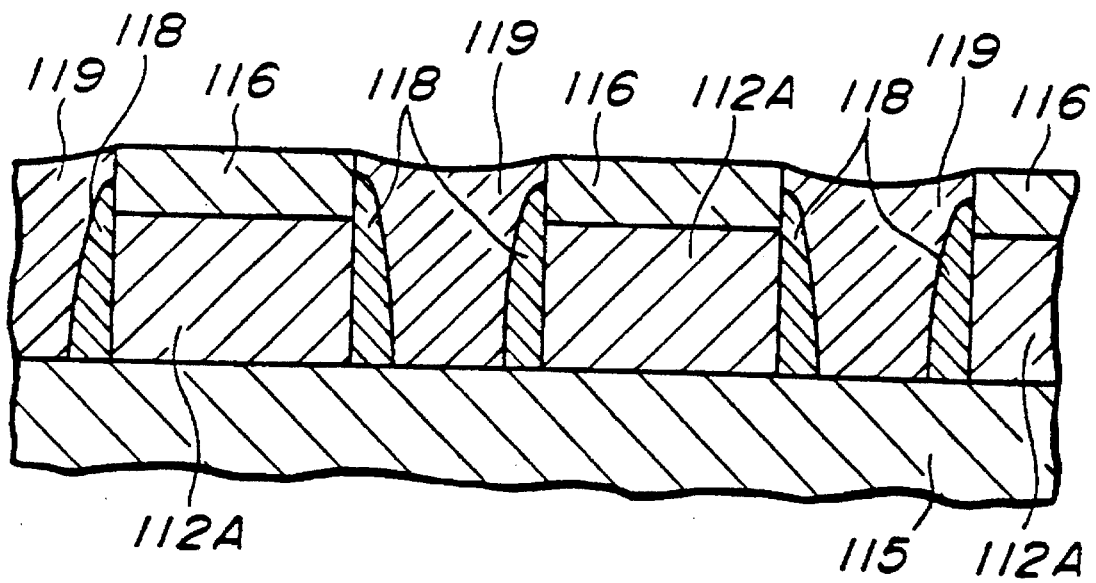
Figure 16:
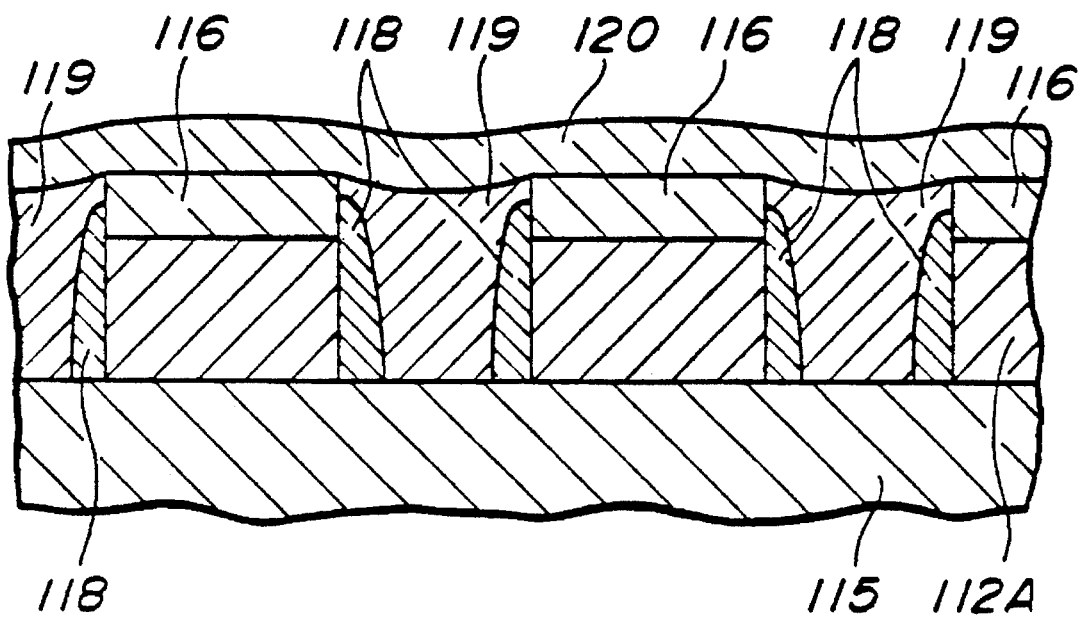

Next, as shown in FIG. 15, heat CVD is performed for embedding and flattening between the copper wiring 112A to form a TEOS-$SiO_2$ film 119. The conditions for the heat CVD are as follows.

| Flow Rate of Gas: | |
| --- | --- |
| 1) TEOS (He Bubbling) | $2000_{SCCM}$ |
| 2) $O_2$ ($O_3$ Content 4%) | $2000_{SCCM}$ |
| Pressure of Gas: | 50 Torr |
| Temperature of Substrate: | 390° C. |

Next, a P-$SiO_2$ film 120 is formed on the $SiO_2$ mask 116 and the TEOS-$SiO_2$ film 119 by the PECVD method. The CVD conditions are as follows.

| Flow Rate of Gas: | |
| --- | --- |
| 1) TEOS (He Bubbling) | $350_{SCCM}$ |
| 2) $O_2$ ($O_3$ Content 4%) | $350_{SCCM}$ |
| Pressure of Gas: | 10 Torr |
| RF Power: | 350 W |
| Temperature of Substrate: | 390° C. |

Since the side wall of the P-$SiO_2$ is used for maintaining pressures between the copper wiring 112A, it is possible to assure the flattening between the copper wiring 112A by means of the TEOS-$SiO_2$ film 119 if the $SiO_2$ mask 116 is left, and it is therefore possible to omit the mask removing step.

Figure 17:
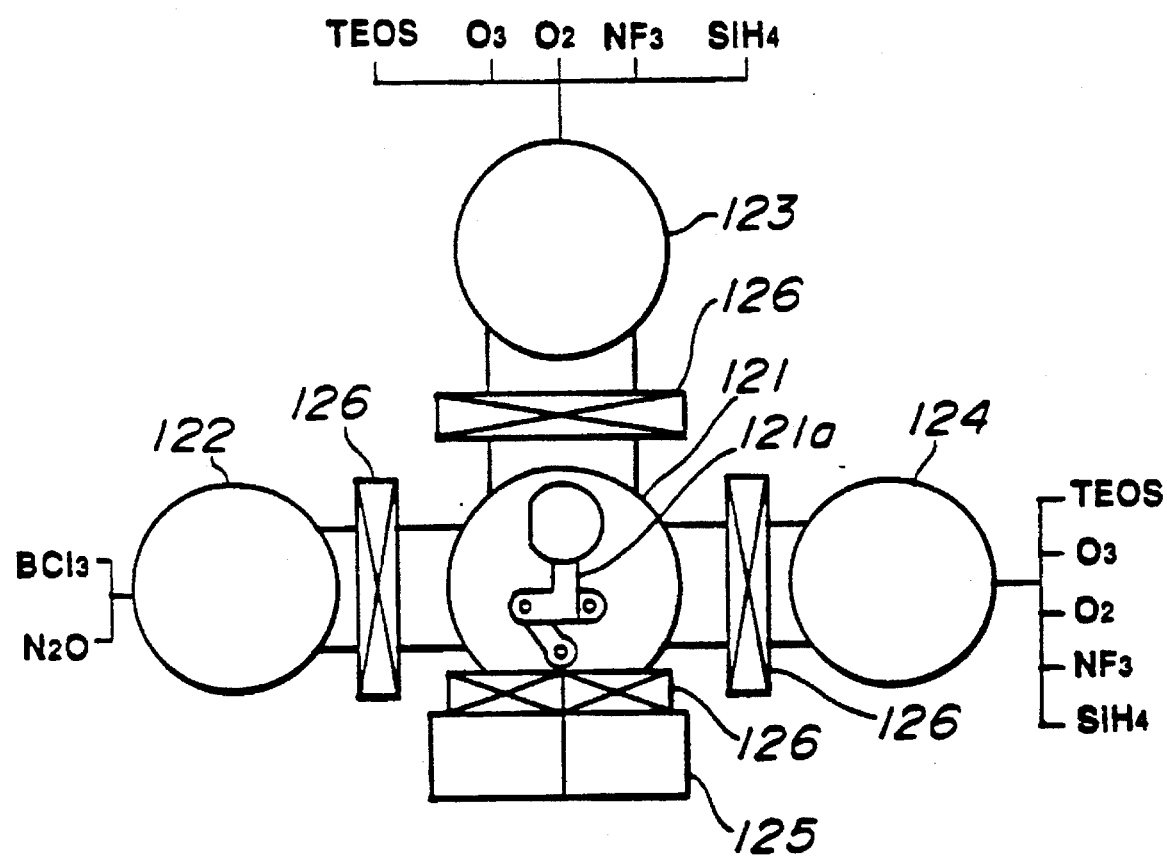
FIG. 17 is a schematic view of a multichamber processing apparatus which can be applied to the sixth preferred embodiment.

Furthermore, since the process of this embodiment can be continuously performed by means of a multichamber processing apparatus as shown in FIG. 17, it is possible to improve throughput.

The multichamber apparatus of FIG. 17 generally comprises a buffer chamber 121 which has a wafer carrying arm 121a and a heating stage (not shown), a first chamber 122 and second chambers 123 and 124, and a loadlock chamber 125. The chambers 122 to 125 are respectively connected to the buffer chamber 121 via gate valves 26 in parallel.

The first chamber 122 is a chamber for ECR etching and for receiving therein boron trichloride ($BCl_3$) gas and $N_2$ gas. The second chambers 123 and 124 are chambers for performing thermal CVD (TEOS/$O_3$) by surface lamp heating, PECVD(P-$SiO_2$) by RF application, and plasma etch-back, and for receiving therein tetraethoxysilane (TEOS), $O_3$, $O_2$, nitrogen trifluoride ($NF_3$) and silane ($SiH_4$).

In a case where this multichamber processing apparatus is applied to the aforementioned sixth embodiment, after etching the copper film 112 in the first chamber 122, the wafer is moved to the second chamber 123 in which CVD and etch-back of P-$SiO_2$ film 118. CVD of the TEOS-$SiO_2$ film 119, and CVD of the P-$SiO_2$ film 120 are sequentially performed in the second chamber 123. In such a multichamber processing apparatus, it is possible to remarkably improve throughput if two second chambers are provided.

Figure 18:
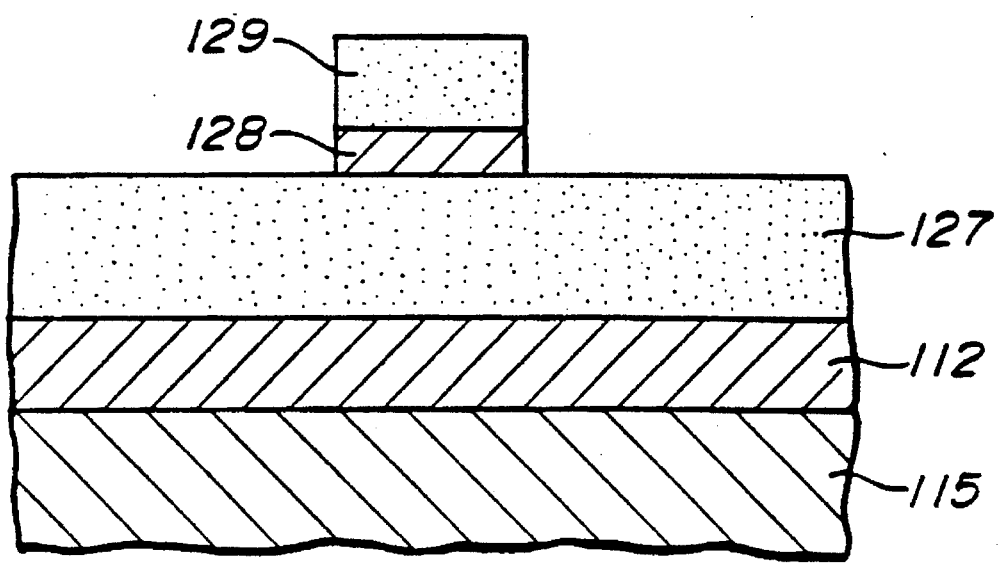
FIG. 18 is a schematic view showing the seventh preferred embodiment of a process for forming a wiring of a copper containing metal according to the present invention.

FIG. 18 shows the seventh preferred embodiment of a process for forming wiring of a copper containing metal, according to the present invention.

In this embodiment, a multilayer resist film comprising at least one organic polymer film and at least one oxidation-resistant film, is formed on a copper containing metallic film. When dry etching and over-etching of the organic polymer film are performed by using at least one of the aforementioned oxidation-resistant films as etching masks, an etching gas comprising a mix of first and second gases is used, the first gas being selected from the group consisting of a mixed gas of a nitrogen containing gas, an oxygen containing gas, and a nitrogen oxide (NOx) containing gas, and the second gas being selected from the group consisting of a chlorine containing gas or a bromine containing gas.

As shown in FIG. 18, the copper film 112 is caused to accumulate on the layer insulation film 115. On the copper film 112, a lower resist layer 127 consisting of an organic polymer film made of a novolak resin of posiresist, an oxidation-resistant intermediate layer 128 made of a spin on glass (SOG), and an upper resist layer 129 are sequentially applied as multilayer resists. Next, after patterning of the upper resist layer 129 is performed by means of an eximer laser stepper, the intermediate layer 128 is etched by means of a magnetron RIE. Furthermore, the thicknesses of the copper film 112, the lower resist layer 127, the intermediate layer 128 and the upper resist layer 129 are set to 5000 Å, 1 μm, 2000 Å and 7000 Å, respectively.

Next, the lower resist layer 127 is etched by means of a RF bias application type magnetic-field microwave etching apparatus. The etching conditions are as follows.

| Flow Rate of Etching Gas: | |
| --- | --- |
| 1) Oxygen ($O_2$) | $20_{SCCM}$ |
| 2) Chlorine ($Cl_2$) | $30_{SCCM}$ |
| Pressure: | 10 mTorr |
| Microwave Current: | 290 mA |
| RF Bias: | 300 W |

After the patterning of the lower resist layer 127 is performed, the copper film 112 is etched by using the patterned lower resist layer 127 as a mask. The conditions for this etching are as follows.

| Flow Rate of Etching Gas: | |
| --- | --- |
| 1) Oxygen ($O_2$) | $20_{SCCM}$ |
| 2) Boron Trichloride ($BCl_3$) | $30_{SCCM}$ |
| 3) Nitrogen Dioxide | $20_{SCCM}$ |
| Pressure: | 10 mTorr |
| Microwave Current: | 250 mA |
| RF Bias: | 200 W |

In the case of conventional etching processes for copper film, since the copper film is attached to the side walls of the mask again, it is difficult to remove it. In this embodiment, since copper oxide (e.g. CuO, $Cu_2O$) and copper halide (e.g. $CuCl_2$, CuBr) are changed into $Cu(NO_3)_2$ which is an active product having high vapor-pressure to be discharged, it is possible to accomplish a good dry etching processing.

In this seventh embodiment, although $Cl_2$ gas was used as the etching gas in the etching of the lower resist layer 127, hydrogen bromide (HBr) may be substituted for $Cl_2$. In addition, although $NO_2$ gas was used as the etching gas in the etching of the copper film 112, nitrogen ($N_2$) or other nitrogen oxide (NOx) gases may be substituted for $NO_2$.

Furthermore, other etching conditions and other multilayer resist structures may be used.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modifications to the illustrated embodiments which can be embodied without departing from the principle of the invention as set forth in the appended claims.

What is claimed is:

1. A method for forming a copper wiring in a semiconductor device, comprising the steps of:

providing a pattern mask on a copper film;

etching exposed portions of the copper film to form a copper wiring;

depositing an insulation film over the copper wiring and including on side walls thereof;

removing a portion of the insulation film to leave an insulation film substantially only on side walls of the copper wiring which is thinner than before the removing;

forming a first dielectric film between the copper wiring up to a top of the pattern mask but not on top of the pattern mask so as to embed and flatten regions between the copper wiring and pattern mask so that those regions are substantially level with the top of the pattern mask; and forming a second dielectric layer on the first dielectric layer so as to provide a flat surface over the copper wiring and pattern mask.

2. A method according to claim 1 wherein the copper film is provided on a layer insulation film and the step of etching to form the wiring occurs down to and no lower than the layer insulation film on which the copper film is provided.

3. A method according to claim 1 including the step of removing said portion of the insulation film to leave said insulation film on side walls of the copper wiring which is thinner than before the removing by a magnetic-field plasma etching.

* * * * *